(12) United States Patent
Dai

(10) Patent No.: US 7,561,440 B2
(45) Date of Patent: Jul. 14, 2009

(54) EXPANSION CARD RETENTION ASSEMBLY

(75) Inventor: Bin Dai, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 184 days.

(21) Appl. No.: 11/309,746

(22) Filed: Sep. 21, 2006

(65) Prior Publication Data

US 2007/0242442 A1 Oct. 18, 2007

(30) Foreign Application Priority Data

Apr. 14, 2006 (CN) .......................... 2006 1 0060293

(51) Int. Cl.
*H05K 7/12* (2006.01)
(52) U.S. Cl. .................. 361/801; 361/726; 361/747; 361/759; 361/732; 361/740; 312/223.2
(58) Field of Classification Search .......... 361/726, 361/732, 740, 747, 759, 801; 312/223.2, 312/223.3
See application file for complete search history.

(56) References Cited

U.S. PATENT DOCUMENTS 6,138,839 A * 10/2000 Cranston et al. .......... 211/41.17
6,256,191 B1 * 7/2001 Curlee ......................... 361/683
6,442,038 B1 * 8/2002 Erickson et al. ............. 361/759
6,515,867 B2 * 2/2003 Sheng-Hsiung et al. ..... 361/759
6,960,720 B2 * 11/2005 Wen-Lung ................... 174/50
7,054,164 B2 * 5/2006 Shih-Tsung ................. 361/801
7,254,041 B2 * 8/2007 Chen et al. .................. 361/801
7,388,759 B2 * 6/2008 Chen et al. .................. 361/801
7,440,288 B1 * 10/2008 Chang ........................ 361/755

* cited by examiner

*Primary Examiner*—Dameon E Levi
(74) *Attorney, Agent, or Firm*—Steven M. Reiss

(57) ABSTRACT

An expansion card retention assembly (100) is provided. The retention assembly includes an expansion frame (11) and a latching device (12). The expansion frame includes an expansion seat (111), and the expansion seat is configured for receiving an expansion card (20) therein. The latching device is positioned adjacent to one end portion of the expansion frame. The latching device includes a mounted member (14), a locking member (13), and a spring member. The mounted member is fixed relatively to the expansion frame. The locking member is operable to rotate away from the mounted member, so as to abut against an expansion card bracket of the expansion card toward the expansion seat of the expansion frame. The spring member is mounted between the mounted member and the locking member to bias the locking member away from the mounted member.

18 Claims, 5 Drawing Sheets

EXPANSION CARD RETENTION ASSEMBLY

FIELD OF THE INVENTION

The present invention generally relates to assemblies for securing a plurality of expansion cards in an electronic device enclosure.

DISCUSSION OF THE RELATED ART

With the development of information processing technology, electronic devices such as personal computers are now widely used. These electronic devices enable consumers to enjoy the convenience of high-tech services. Expansion cards such as network cards, sound cards, and small computer system interface cards (SCSIs) having special circuits that are widely used in the electronic devices to enhance or specialize their functions.

Referring now to FIG. 1, a typical retention assembly for securing an expansion card 40 to an electronic device enclosure 30 is shown. The enclosure 30 includes a main chassis 33, and a side chassis 34 perpendicular to the main chassis 33. A main circuit board 331, for example a motherboard, is positioned on the main chassis 33. The main circuit board 331 defines a plurality of expansion slots 3311, and the expansion slots 3311 are aligned parallel to each other. The retention assembly includes an expansion frame 31 formed on the side chassis 34, and a screw 32 that may be engaged in the expansion frame 31. The expansion frame 31 defines a plurality of expansion seats 311 corresponding to the expansion slots 3311. The expansion frame 31 includes a plurality of support platforms 312 located at one end of the expansion seats 311 corresponding to the expansion seats 311. Each support platform 312 defines a screw hole 313. The expansion card 40 includes an expansion card circuit board 41, and an expansion card bracket 42 extending from one end of expansion card circuit board 41. The expansion card bracket 42 has a flange 43 formed at an end thereof. A notch 44 is defined on the flange 43.

In use, the expansion card 40 is received in the enclosure 30, with the expansion card circuit board 41 inserted in the expansion slot 3311, and the expansion card bracket 42 seated in the expansion seat 311. The flange 43 of the expansion card 40 abuts against the corresponding support platform 312, with the notch 44 aligned with the screw hole 313 correspondingly. The screw 32 passes through the notch 44 of the expansion card 40, and is finally received in the screw hole 313 of the expansion frame 31. Thus, the expansion card bracket 42 of the expansion card 40 is held steadily in the expansion frame 31, and the expansion card 40 is held in the enclosure 30. A plurality of expansion cards 40 can be received in the enclosure 30 in this way. The expansion card 40 can be removed after moving off the screw 32 from the enclosure 30.

In the above retention assembly, the expansion cards 40 are directly secured in the enclosure 30 by using the screws 32. Each expansion card 40 needs one screw 32. Fastening or detachment of the screws 32 is unduly time-consuming and laborious. This retards the efficiency of installation and removal of the expansion cards 40. These problems are multiplied in mass production facilities, and result in increased costs.

Therefore, there is a need for a new retention assembly, which can hold the surface contact card steadily in a portable electronic device.

SUMMARY

An expansion card retention assembly includes an expansion frame and a latching device. The expansion frame includes an expansion seat, and the expansion seat is configured for receiving an expansion card therein. The latching device is positioned adjacent to one end portion of the expansion frame. The latching device includes a mounted member, a locking member, and a spring member. The mounted member is fixed relatively to the expansion frame. The locking member is operable to rotate away from the mounted member, so as to abut against an expansion card bracket of the expansion card toward the expansion seat of the expansion frame. The spring member is mounted between the mounted member and the locking member to bias the locking member away from the mounted member.

Other novel features will become more apparent from the following detailed description, when taken in conjunction with the accompanying drawings.

BRIEF DESCRIPTION OF THE DRAWINGS

Many aspects of the retention assembly can be better understood with reference to the following drawings. The components in the drawings are not necessarily drawn to scale, the emphasis instead being placed upon clearly illustrating the principles of the present retention assembly. Moreover, in the drawings, like reference numerals designate corresponding parts throughout the several views.

DETAILED DESCRIPTION OF THE EMBODIMENTS

Figure 1:
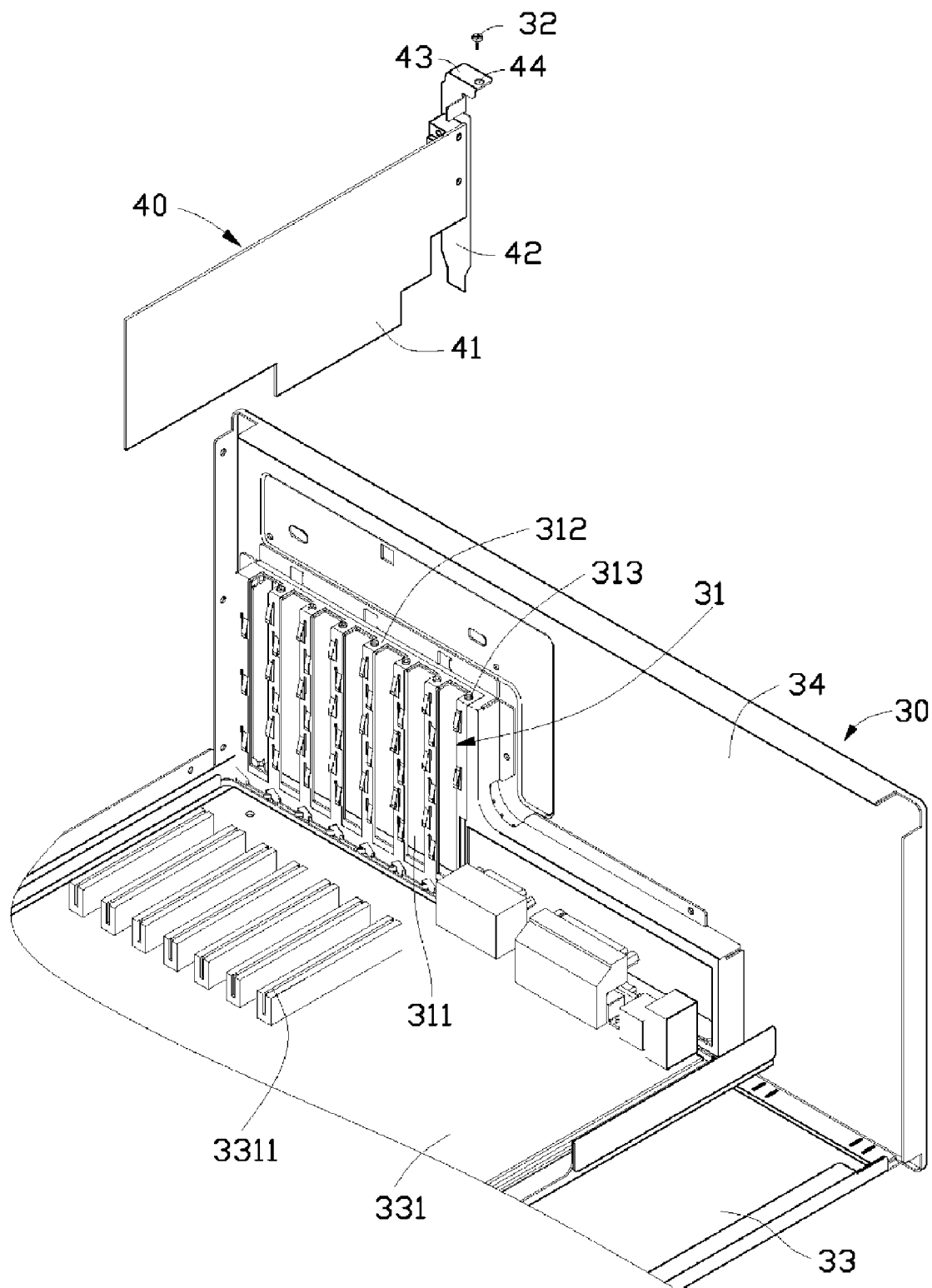
FIG. 1 is an exploded, isometric view of a conventional retention assembly.
Figure 2:
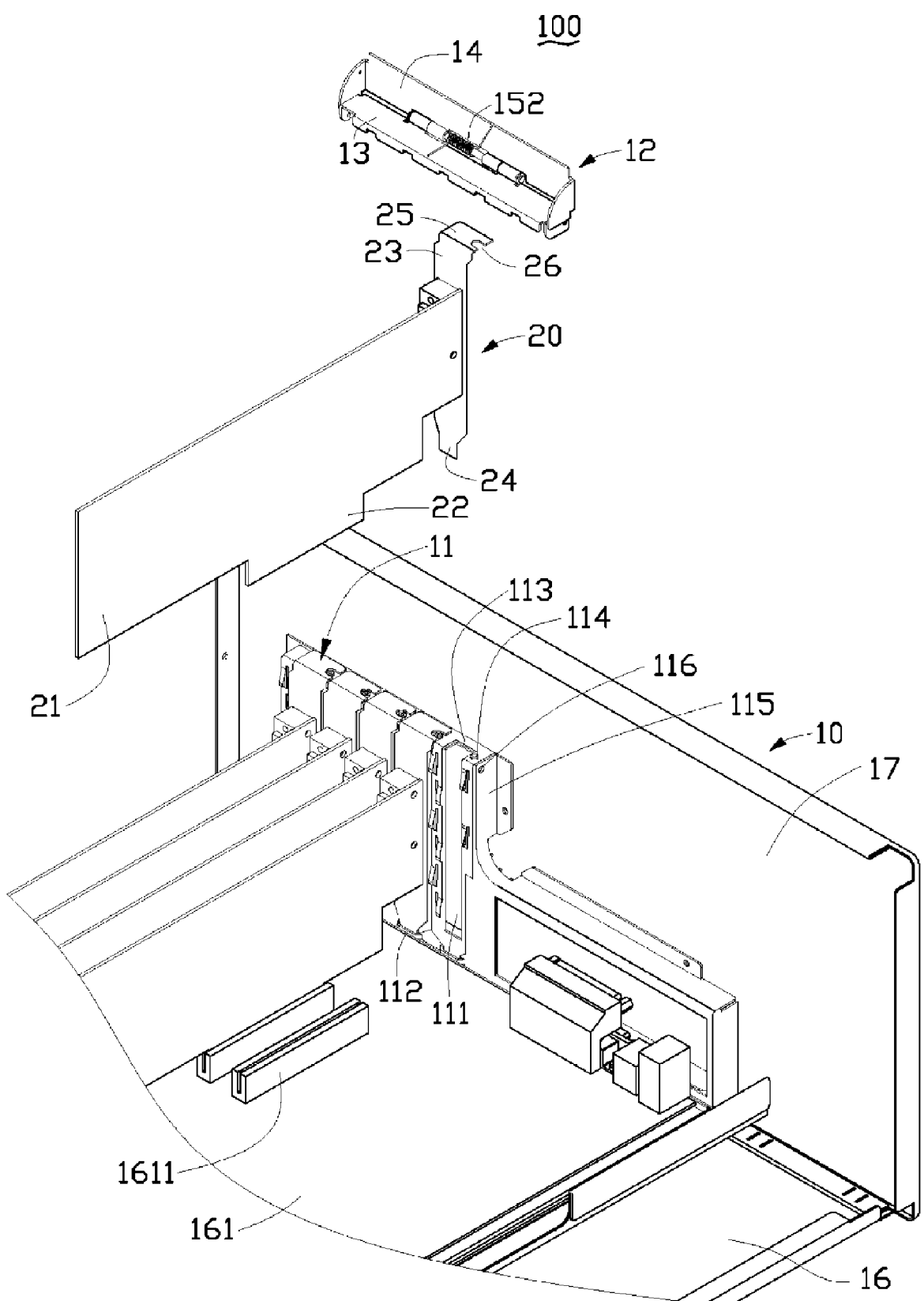
FIG. 2 is an exploded, isometric view of a retention assembly having a latching device in accordance with a preferred embodiment.

Referring now to the drawings in detail, FIG. 2 shows a retention assembly 100 for an expansion card 20 incorporated in a computer/electronic device enclosure 10. The computer enclosure 10 and the expansion card/adapter card 20 are taken here as an exemplary application for the purposes of describing details of the retention assembly 100 of the preferred embodiment. The computer enclosure 10 includes a main chassis 16, and a side chassis 17 perpendicularly extending from an edge of the main chassis 16. A main circuit board 161, for example a motherboard, is positioned on the main chassis 16. The main circuit board 161 defines a plurality of expansion slots 1611, and the expansion slots 1611 are aligned parallel to each other. An expansion frame 11 is formed on the side chassis 17. The expansion card 20 includes an expansion card circuit board 21, an expansion card plug 22 extending from an end thereof and an expansion card bracket 23 extending from another end thereof. The expansion card bracket 23 has a tab 24 formed at an end thereof, and a flange 25 formed at an opposite end thereof. A notch 26 is defined on the flange 25. The retention assembly 100 includes the expansion frame 11, and a latching device 12 mounted adjacent to the expansion frame 11.

The expansion frame 11 defines a plurality of expansion seats 111 corresponding to the expansion slots 1611. Each expansion seat 111 is configured for receiving the expansion card bracket 23 of the expansion card 20. The expansion frame 11 further defines a plurality of tab slots 112 corresponding to the expansion seats 111, and the tab slots 112 are adjacent to an end of the expansion seats 111. Each tab slot 112 is configured for receiving the tab 24 of the expansion card 20. The expansion frame 11 includes a plurality of support platforms 113 corresponding to the expansion seats 111, and the support platforms 113 locate at another end of the expansion seats 111. Each support platform 113 is configured for holding the flange 25 of the expansion card 20. Each support platform 113 defines a receiving hole 114. The support platforms 113 cooperatively form a support surface (not labeled), and the support surface is substantially a top surface of the expansion frame 11. The expansion frame 11 further includes a pair of sidewalls 115 connecting the support platforms 113. Each sidewall 115 defines a first aperture 116, and each first aperture 116 locates adjacent to the support platforms 113.

Figure 3:
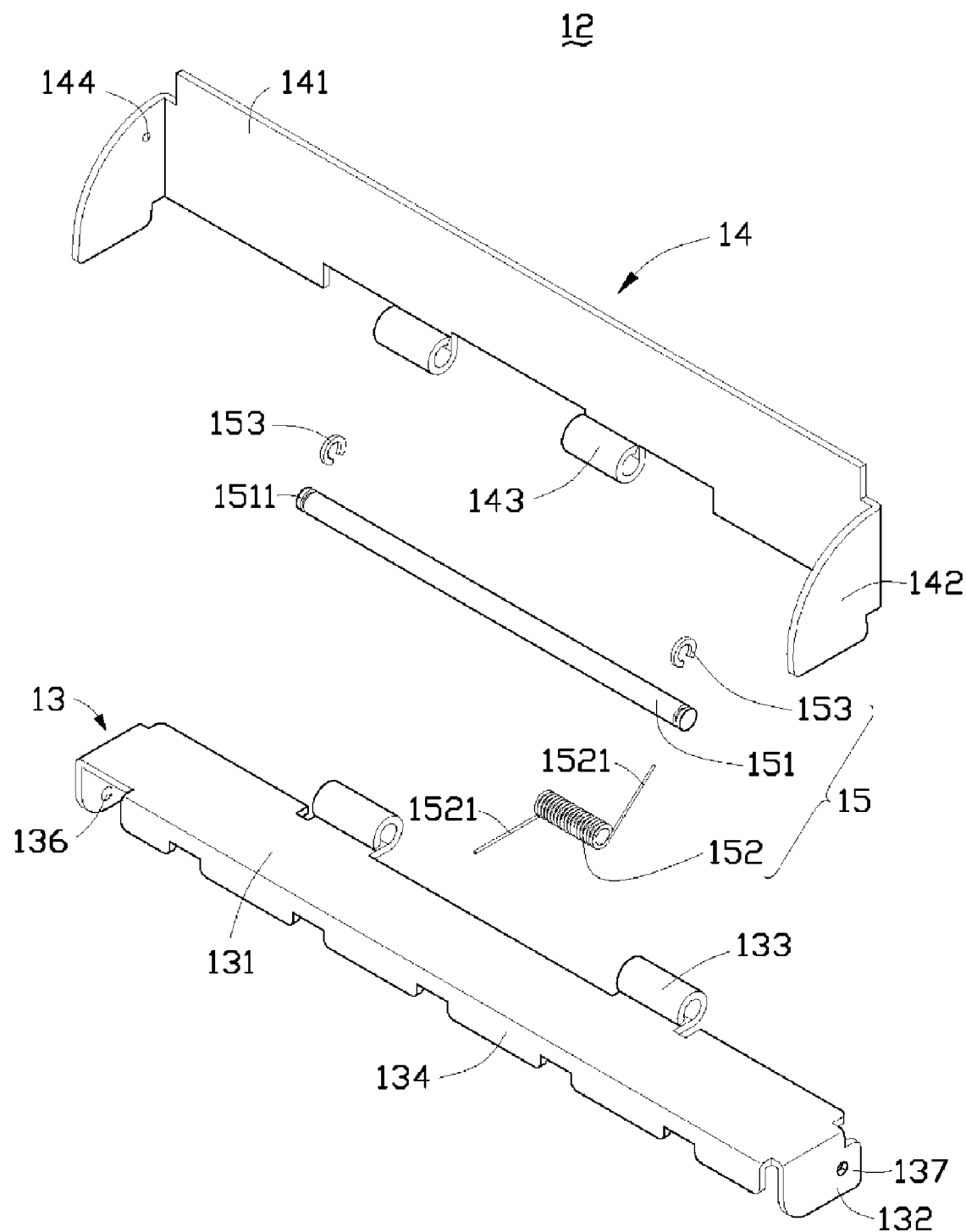
FIG. 3 is an enlarged, exploded, isometric view of the latching device of FIG. 2.

Referring also to FIG. 3, the latching device 12 includes a locking member 13, a mounted member 14, and a hinge 15 connecting the locking member 13 and the mounted member 14.

The locking member 13 includes a main board 131, and a pair of symmetrical side boards 132 perpendicularly extending from two opposite ends of the main board 131 in a same direction. In alternative embodiments, one of the side boards 132 may be omitted. The main board 131 is substantially a rectangular board. A pair of symmetrical sleeves 133 are formed at a side of the main board 131. In alternative embodiment, the number of the sleeve(s) 133 may be one, three, or more. Each sleeve 133 is substantially a hollow cylinder having a cylindrical axis lying on a planar surface parallel to the side of the main board 131. A plurality of plates 134 extends perpendicularly from another side of the main board 131 in the direction corresponding to the side boards 132. A plurality of bolts 135 (shown in FIG. 5) extends from the main board 131 in the direction corresponding to the side boards 132. The shape and quantity of the bolts 135 correspond to the receiving holes 114 of the expansion frame 11. The side boards 132 are made of resilient material, for example plastic material. Each side board 132 is substantially a rectangular board. Each side board 132 is disposed with a first protrusion 136 on an inner surface thereof. The first protrusions 136 are received in the first apertures 116 of the expansion frame 11 correspondingly. Each side board 132 defines a second aperture 137. The second aperture 137 may be a through hole, or a blind hole defined in an outer surface opposite to the inner surface of the side board 132.

The mounted member 14 includes a main panel 141, and a pair of symmetrical side panels 142 perpendicularly extending from two opposite ends of the main panel 141 in parallel directions. In alternative embodiment, one of the side panels 142 may be omitted. The main panel 141 is substantially a rectangular board. A pair of symmetrical sleeves 143 are formed at one side of the main panel 141. In alternative embodiment, the number of the sleeve(s) 143 may be one, three, or more. The shape and size of the sleeves 143 correspond to the sleeves 133 of the locking member 13. The side panels 142 are made of resilient materials, for example plastic materials. Each side panel 142 is substantially an arc-shaped board. Each side panel 142 is disposed with a second protrusion 144 on an inner surface thereof. The second protrusions 144 are received in the second apertures 137 of the locking member 13 correspondingly.

The hinge 15 includes a shaft 151, a torsion spring 152, and a pair of clips 153. The shaft 151 is substantially cylindrical, and defines two recesses 1511 at opposite ends thereof, respectively. The torsion spring 152 is helical and preferably metallic, and two arms 1521 extend at opposite ends thereof. The clips 153 are substantially C-shaped, and are received in the recesses 1511 of the shaft 151, correspondingly.

Figure 4:
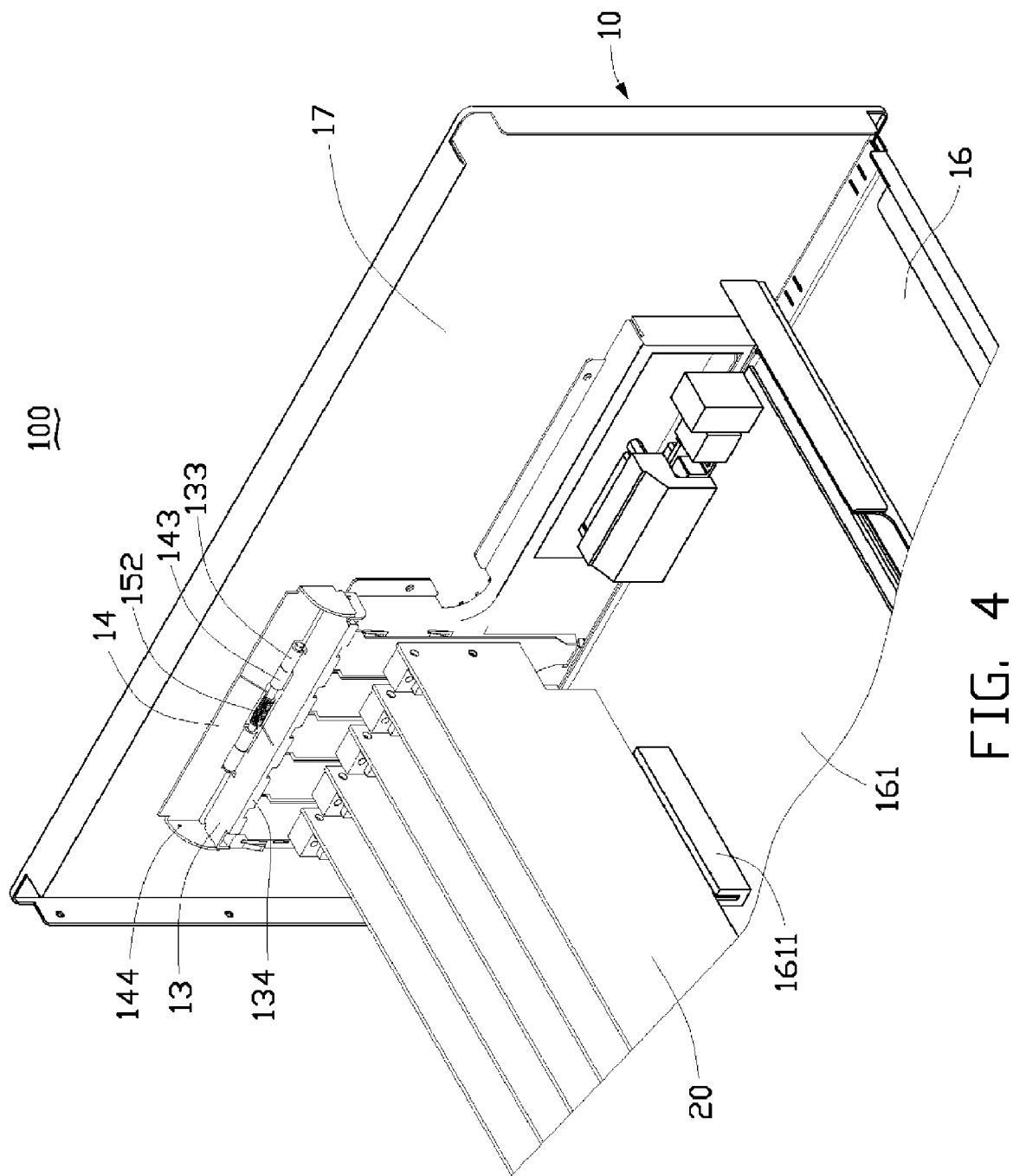
FIG. 4 is an enlarged, assembled, isometric view showing the latching device in a locked state of FIG. 2.

Referring also to FIG. 4, in assembly of the latching device 12, the shaft 151 passes through one of sleeves 133 of the locking member 13, one of the sleeves 143 of the mounted member 14, the torsion spring 152, the other sleeve 143 of the mounted member 14, the other sleeve 133 of the locking member 13 in that order. The clips 153 are received in the recesses 1511 of the shaft 151 correspondingly, thereby preventing the shaft 151 from sliding out from the sleeves 133 and 143. Thus, the locking member 13 is pivotably connected with the mounted member 14 via the hinge 15. The mounted member 14 is attached (e.g. welded or screwed) to the side chassis 17 of the computer enclosure 10, adjacent to the expansion frame 11. The torsion spring 152 has a pre-torsional force. One of the arms 1521 abuts against the main board 131 of the locking member 13, and the other of the arms 1521 abuts against the main panel 141 of the mounted member 14. The locking member 13 abuts against the support platforms 113 of the expansion frame 11.

In use, the locking member 13 is flipped towards the main panel 141 of the mounted member 14 by a first external force until the second protrusions 144 of the mounted member 14 are engaged in the corresponding second apertures 137 of the locking member 13. At this time, the locking member 13 is fixed within the mounted member 14, and is detached from the support platforms 113 of the expansion frame 11. The torsion spring 152 is thereby coiled and accumulates potential energy. The expansion card 20 is received in the computer enclosure 10, with the expansion card plug 22 inserted in the expansion slot 1611, and the expansion card bracket 23 seated in the corresponding expansion seat 111. At the same time, the tab 24 of the expansion card bracket 23 is received in the tab slot 112 correspondingly, the flange 25 of the expansion card bracket 23 abuts against the corresponding support platform 113, with the notch 26 of the expansion card bracket 23 aligned with the receiving hole 114 correspondingly. A plurality of expansion cards 20 are received into the computer enclosure 10 in this way. In the illustrated embodiment, five expansion cards 20 are received into the computer enclosure 10.

A second external force is applied on the locking member 13, such that the second protrusions 144 of the mounted member 14 deforms and disengages with the second apertures 137 of the locking member 13. The locking member 13 is automatically flipped/sprung out from the mounted member 14 by the torsional force of the torsion spring 152 until the locking member 13 abuts against the flanges 25 of the expansion cards 20. The bolts 135 of the locking member 13 passes through the notches 26 of the expansion cards 20 correspondingly, and are finally received in the corresponding receiving holes 114 of the expansion frame 11. The locking member 13 is pressed by a third external force until the first protrusions 136 of the locking member 13 are engaged in the corresponding first apertures 116 of the expansion frame 11, with the plates 134 of the locking member 13 abutting against the expansion card brackets 23 of the expansion cards 20. The latching device 12 can prevent the expansion card bracket 23 of the expansion card 20 from moving out of the expansion frame 11. Thus, the expansion card bracket 23 of the expansion card 20 is held steadily in the expansion frame 11, and the expansion card 20 is held steadily in the computer enclosure 10. At this time, the latching device 12 is in a locked state.

Figure 5:
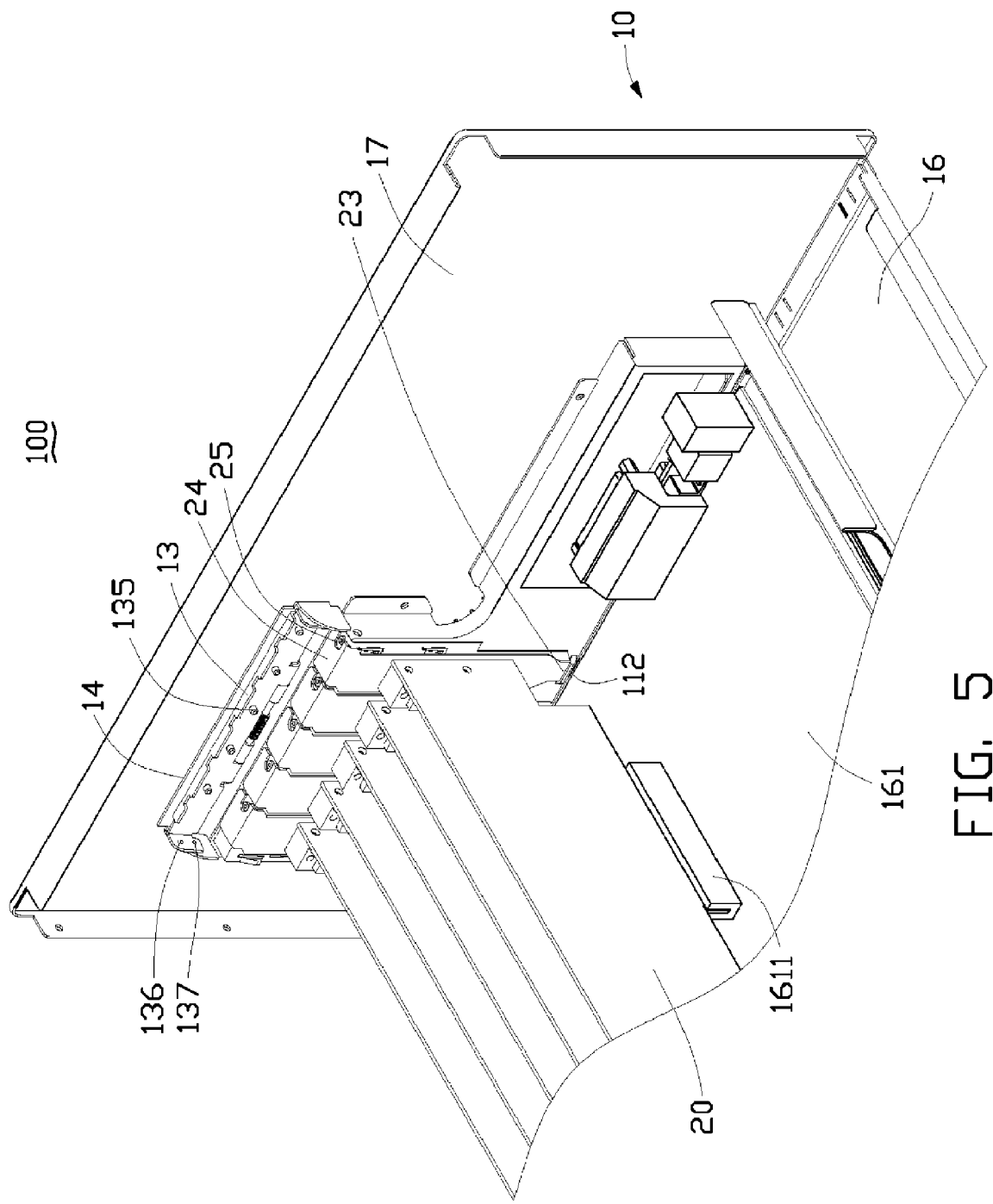
FIG. 5 is similar to FIG. 4, but showing the latching device in an unlocked state.

Referring also to FIG. 5, to remove the expansion card 20, the first external force is applied on the locking member 13, such that the first protrusions 136 of the locking member 13 deforms and disengages with the first apertures 116 of the expansion frame 11. The locking member 13 is rotated towards the main panel 141 until the second protrusions 144 of the mounted member 14 engages in the corresponding second apertures 137 of the locking member 13. At this time, the locking member 13 is relatively fixed within the mounted member 14, and the bolts 135 are pulled away from the flanges 25 of the expansion cards 20. The torsion spring 152 is thereby coiled and accumulates potential energy. At this time, the latching device 12 is in an unlocked state. The expansion cards 20 are removed the computer enclosure 10 conveniently.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An expansion card retention assembly, the retention assembly comprising:
    an expansion frame having an expansion seat, the expansion seat being configured for receiving an expansion card therein; and
    a latching device positioned adjacent to one end portion of the expansion frame, the latching device including:
        a mounted member fixed relatively to the expansion frame;
        a locking member being operable to rotate away from the mounted member, so as to abut against an expansion card bracket of the expansion card toward the expansion seat of the expansion frame; and
        a torsion spring mounted between the mounted member and the locking member to bias the locking member away from the mounted member;
    wherein the locking member comprises a main board having a first cylindrical sleeve, the mounted member comprises a main panel having a second cylindrical sleeve, the latching device further comprises a hinge having a shaft, the shaft passes through the first and second sleeves, and the torsion spring to pivotably connect the locking member and the mounted member.

2. The retention assembly as claimed in claim 1, wherein the expansion frame comprises a support platform defined at one end of the expansion seat corresponding to the expansion seat.

3. The retention assembly as claimed in claim 1, wherein the end portion of the expansion frame defines a receiving hole, the locking member includes a main board, and the main board includes a bolt engaged in the receiving hole.

4. The retention assembly as claimed in claim 1, wherein the expansion frame includes a side wall adjoining the end portion, the side wall defines a first aperture, the locking member includes a side board having a first protrusion, and the first protrusion is engaged in the first aperture.

5. The retention assembly as claimed in claim 1, wherein the locking member includes a side board having a second aperture, the mounted member includes a side panel having a second protrusion, and the second protrusion is engaged in the second aperture.

6. The retention assembly as claimed in claim 1, wherein the shape and size of the second sleeve correspond to those of the first sleeve.

7. The retention assembly as claimed in claim 6, wherein the main board comprises a plate configured for abutting against the expansion card.

8. The retention assembly as claimed in claim 1, wherein the torsion spring includes a pair of arms, one arm abutting against the locking member, and the other arm abutting against the mounted member.

9. The retention assembly as claimed in claim 1, wherein the shaft comprises a pair of recesses defined at two opposite ends thereof, the hinge further comprises a pair of clips, the clips are C-shaped, and are engaged in the recesses correspondingly.

10. A retention assembly for latching an expansion card into a device enclosure, comprising:
    an expansion frame formed on the device enclosure, and configured for receiving the expansion card therein; and
    a latching device positioned adjacent to the expansion frame, the latching device including:
        a mounted member fixed relatively to the expansion frame; and
        a locking member rotatably attached to the mounted member, wherein the locking member is rotatable between a locking position for pressing an expansion card bracket of the expansion card against the expansion seat, and a releasing position for releasing the expansion card bracket, wherein in the locking position, the locking member engages with the expansion frame in a manner so as to retain the locking member in the locking position, and wherein in the releasing position, the locking member engages with the mounted member in a manner so as to retain the locking member in the releasing position;
    wherein the locking member comprises a main board having two first sleeves, the mounted member comprises a main panel having two second sleeves, the latching device comprises a hinge having a shaft and a torsion spring the shaft passes through the first and second sleeves, and the torsion spring to pivotably connect the locking member and the mounted member, with the second sleeves being positioned between the first sleeves, and the torsion spring being positioned between the second sleeves.

11. The retention assembly as claimed in claim 10, wherein the expansion frame includes a plurality of expansion seats, a plurality of tab slots adjacent to one end of the expansion seats, and a plurality of support platforms located at the other end of the expansion seats.

12. The retention assembly as claimed in claim 11, wherein each support platform defines a receiving hole, the locking member includes a main board, and the main board includes a plurality of bolts engaged in the corresponding receiving holes.

13. The retention assembly as claimed in claim 11, wherein the expansion frame comprises a pair of side walls connecting the support platforms, each side wall defines a first aperture, the locking member comprises a pair of side boards, each side board has a first protrusion engaged in the corresponding first aperture.

14. The retention assembly as claimed in claim 10, wherein the locking member comprises a pair of side boards each having a second aperture, the mounted member includes a pair of side panels each having a second protrusion, and the second protrusion is engaged in the corresponding second aperture.

15. The retention assembly as claimed in claim 10, wherein the torsion spring comprises a pair of arms, one arm abutting against the locking member, and the other arm abutting against the mounted member.

16. An electronic device comprising:
a device enclosure having an expansion frame;
an expansion card having an expansion card bracket seated on the expansion frame;
a latching device positioned adjacent to the expansion frame, the latching device including:
   a mounted member fixed relatively to the expansion frame;
   a locking member pivotably mounted to the mounted member, wherein the locking member is rotatable between a locking position for pressing the expansion card bracket against the expansion frame, and a releasing position for releasing the expansion card bracket; and
   a torsion spring mounted between the mounted member and the locking member to bias the locking member toward the locking position;
wherein the locking member comprises a main board having a first cylindrical sleeve, the mounted member comprises a main panel having a second cylindrical sleeve, the latching device further comprises a hinge having a shaft, the shaft passes through the first and second sleeves, and the torsion spring to pivotaby connect the locking member and the mounted member.

17. The electronic device as claimed in claim 16, wherein the expansion frame comprises a pair of side walls each defining a first aperture, the locking member comprises a pair of side boards each having a first protrusion configured for engaging in the corresponding first aperture in a manner so as to retain the locking member in the locking position.

18. The electronic device as claimed in claim 16, wherein the lacking member comprises a pair of side boards each having a second aperture, the mounted member comprises a pair of side panels each having a second protrusion, and the second protrusion is configured for engaging in the corresponding second aperture in a manner so as to retain the locking member in the releasing position.

* * * * *